United States Patent
Mann et al.

(10) Patent No.: US 6,710,917 B2
(45) Date of Patent: Mar. 23, 2004

(54) 8-MIRROR MICROLITHOGRAPHY PROJECTION OBJECTIVE

(75) Inventors: Hans-Jürgen Mann, Oberkochen (DE); Wilhelm Ulrich, Aalen-Dewangen (DE); Günther Seitz, Spiegelberg (DE)

(73) Assignee: Carl Zeiss SMT AG, Oberkochen (DE)

( * ) Notice: Subject to any disclaimer, the term of this patent is extended or adjusted under 35 U.S.C. 154(b) by 249 days.

(21) Appl. No.: 10/007,307

(22) Filed: Oct. 19, 2001

(65) Prior Publication Data

US 2002/0154395 A1 Oct. 24, 2002

Related U.S. Application Data

(60) Provisional application No. 60/255,216, filed on Dec. 13, 2000.

(30) Foreign Application Priority Data

Oct. 20, 2000 (DE) .......................................... 100 52 289

(51) Int. Cl.[7] ....................... G02B 17/00; G03B 27/72; G21K 5/00
(52) U.S. Cl. ....................... 359/365; 359/858; 359/361; 355/71; 378/34
(58) Field of Search .................... 359/364–367, 359/725–731, 851–872, 350–361; 355/52–64, 21; 378/34, 43, 84–85, 145; 250/492.2

(56) References Cited

U.S. PATENT DOCUMENTS

| | | | |
|---|---|---|---|
| 5,153,898 A | 10/1992 | Suzuki et al. ................. | 378/34 |
| 5,315,629 A | 5/1994 | Jewell et al. ................. | 378/34 |
| 5,686,728 A | 11/1997 | Shafer ...................... | 250/492.2 |
| 5,815,310 A | 9/1998 | Williamson .................. | 359/365 |
| 6,033,079 A | 3/2000 | Hudyma ..................... | 359/857 |
| 6,353,470 B1 * | 3/2002 | Dinger ........................ | 355/71 |
| 6,556,648 B1 * | 4/2003 | Bal et al. ..................... | 378/34 |

FOREIGN PATENT DOCUMENTS

| | | |
|---|---|---|
| EP | 0252734 A2 | 1/1988 |
| EP | 0480617 B1 | 4/1992 |
| EP | 0779528 A2 | 6/1997 |
| EP | 0947882 A2 | 10/1999 |
| EP | 0955641 A1 | 11/1999 |
| EP | 1093021 A2 | 4/2001 |
| WO | WO99/57606 | 11/1999 |

\* cited by examiner

*Primary Examiner*—Thong Nguyen
(74) *Attorney, Agent, or Firm*—Ohlandt, Greeley, Ruggiero & Perle, LLP (57) ABSTRACT

A projection objective provides a light path for a light bundle from an object field in an object plane to an image field in an image plane. The projection objective comprises a first mirror (S1), a second mirror (S2), a third mirror (S3), a fourth mirror (S4), a fifth mirror (S5), a sixth mirror (S6), a seventh mirror (S7), and an eighth mirror (S8). The light path is provided via the eight mirrors, the light bundle includes light with a wavelength in the range of 10–30 nm, and the light path is free of shading.

29 Claims, 11 Drawing Sheets

| ELEMENT NUMBER | RADIUS | THICKNESS | DIAMETER | TYPE |
|---|---|---|---|---|
| OBJECT | INF | 437.8550 | | |
| S1 | A(1) | -248.1062 | 218.4102 | REFL |
| | | APERTURE DIAPHGRAM | 91.5283 | |
| | | 0.0000 | | |
| S2 | A(2) | 193.6511 | 91.5770 | REFL |
| S3 | A(3) | -230.6805 | 193.7182 | REFL |
| S4 | A(4) | 619.7098 | 320.2546 | REFL |
| S5 | A(5) | -169.8751 | 398.3988 | REFL |
| S6 | A(6) | 202.7900 | 280.0000 | REFL |
| S7 | A(7) | -293.6734 | 85.8365 | REFL |
| S8 | A(8) | 326.9836 | 308.4810 | REFL |
| IMAGE | INF | | 55.0127 | |

ASPHERIC CONSTANT $$Z = \frac{(CURV)Y^2}{1+(1-(1+K)(CURV)^2 Y^2)^{1/2}} + (A)Y^4 + (B)Y^6 + (C)Y^8 + (D)Y^{10} + (E)Y^{12} + (F)Y^{14} + (G)Y^{16} + (H)Y^{18} + (J)Y^{20}$$

| ASPHERIC PROFILE | CURV | K | A | B | C | D |
|---|---|---|---|---|---|---|
| | | E | F | G | H | J |
| A(1) | -0.00123747 | 0.000000 | 2.31212 E-09 | -1.20823 E-14 | 5.14612 E-19 | -3.39768 E-23 |
| | | 2.27258 E-27 | -4.42780 E-32 | 0.00000 E+00 | 0.00000 E+00 | 0.00000 E+00 |
| A(2) | 0.00016948 | 0.000000 | -1.89814 E-08 | -2.29358 E-13 | -4.85183 E-19 | 1.15028 E-20 |
| | | -4.21257 E-24 | 5.69674 E-28 | 0.00000 E+00 | 0.00000 E+00 | 0.00000 E+00 |
| A(3) | -0.00011398 | 0.000000 | 6.83150 E-09 | -7.67300 E-14 | -1.83359 E-18 | 5.15096 E-23 |
| | | -6.74819 E-28 | 2.38485 E-32 | 0.00000 E+00 | 0.00000 E+00 | 0.00000 E+00 |
| A(4) | 0.00052128 | 0.000000 | 1.30246 E-09 | 2.58343 E-15 | -1.56164 E-19 | 2.66615 E-24 |
| | | -3.14527 E-29 | 2.08197 E-34 | 0.00000 E+00 | 0.00000 E+00 | 0.00000 E+00 |
| A(5) | -0.00182108 | 0.000000 | 1.19681 E-09 | -5.86576 E-16 | 1.80550 E-19 | -1.61183 E-24 |
| | | 6.43317 E-30 | 9.29849 E-36 | 0.00000 E+00 | 0.00000 E+00 | 0.00000 E+00 |
| A(6) | -0.00107055 | 0.000000 | 2.53003 E-08 | -1.45839 E-12 | 7.48859 E-17 | -1.88858 E-21 |
| | | 1.34840 E-28 | 6.67275 E-31 | 0.00000 E+00 | 0.00000 E+00 | 0.00000 E+00 |
| A(7) | 0.00584900 | 0.000000 | 5.51082 E-08 | 9.28811 E-13 | -4.97336 E-16 | -6.35635 E-20 |
| | | -9.50902 E-24 | -1.70958 E-26 | 0.00000 E+00 | 0.00000 E+00 | 0.00000 E+00 |
| A(8) | 0.00289780 | 0.000000 | 4.07773 E-10 | 3.17817 E-15 | 2.23903 E-20 | 1.62047 E-25 |
| | | 1.06923 E-30 | 3.39378 E-35 | 0.00000 E+00 | 0.00000 E+00 | 0.00000 E+00 |

Reference wavelength = 13.0 nm
Imaging scale = -0.25
Image-side aperture = 0.40

Fig. 8

| ELEMENT NUMBER | RADIUS | THICKNESS | DIAMETER | TYPE |
|---|---|---|---|---|
| OBJECT | INF | 846.0618 | | |
| | | APERTURE DIAPHGRAM | 174.4481 | |
| | | 0.0000 | | |
| S1 | A(1) | -596.9226 | 174.6201 | REFL |
| S2 | A(2) | 1258.0118 | 302.7847 | REFL |
| S3 | A(3) | -560.6789 | 376.8895 | REFL |
| S4 | A(4) | 502.0689 | 132.7627 | REFL |
| S5 | A(5) | -548.1913 | 251.5133 | REFL |
| S6 | 869.9668 CC | 1025.6939 | 825.4854 | REFL |
| S7 | A(6) | -318.8926 | 93.9960 | REFL |
| S8 | A(7) | 349.2051 | 327.8538 | REFL |
| IMAGE | INF | | | |

ASPHERIC CONSTANT $$Z = \frac{(CURV)Y^2}{1 + (1-(1+K)(CURV)^2 Y^2)^{1/2}} + (A)Y^4 + (B)Y^6 + (C)Y^8 + (D)Y^{10}$$

| ASPHERIC PROFILE | CURV | K | A | B | C | D |
|---|---|---|---|---|---|---|
| A(1) | -0.00077091 | 0.000000 | 1.74667 E-09 | 3.88468 E-14 | 2.31479 E-19 | -1.93103 E-23 |
| A(2) | 0.00069673 | 0.000000 | -3.24472 E-10 | 2.27112 E-15 | 7.69172 E-21 | 7.04100 E-26 |
| A(3) | -0.00095818 | 0.000000 | -8.63211 E-11 | -3.33704 E-16 | 3.53842 E-21 | -2.98818 E-26 |
| A(4) | 0.00013409 | 0.000000 | 5.05967 E-09 | 1.60649 E-13 | -2.50451 E-18 | -6.77039 E-22 |
| A(5) | 0.00174877 | 0.000000 | -1.31667 E-09 | 7.91407 E-15 | -1.05690 E-19 | 2.09186 E-24 |
| A(6) | 0.00451027 | 0.000000 | 7.10441 E-08 | 3.63352 E-12 | -1.83737 E-17 | 1.18169 E-20 |
| A(7) | 0.00267159 | 0.000000 | 2.02896 E-10 | 2.44899 E-15 | 2.34247 E-20 | 2.04113 E-25 |

Reference wavelength = 13.0 nm
Imaging scale = - 0.25
Image-side aperture = 0.40

Fig. 9

8-MIRROR MICROLITHOGRAPHY PROJECTION OBJECTIVE

CROSS REFERENCE TO RELATED APPLICATIONS

The present application is claiming priority of U.S. Provisional Patent Application Serial No. 60/255,216, filed on Dec. 13, 2000.

BACKGROUND OF THE INVENTION

1. Field of the Invention

The present invention relates to a microlithography objective for EUV lithography with a wavelength in the range of 10–30 nm for imaging an object field in an image field. The invention also provides for a projection exposure system and a chip manufacturing process.

2. Description of the Prior Art

Lithography with wavelengths <193 nm, particularly EUV lithography with $\lambda=11$ nm or $\lambda=13$ nm are discussed as possible techniques for imaging of structures <130 nm, most preferably <100 nm. The resolution of a lithographic system is given by the following equation:

$$RES = k_1 \cdot \lambda/NA,$$

where $k_1$, denotes a specific parameter of the lithography process, $\lambda$ denotes the wavelength of the incident light and NA denotes the numerical aperture of the system on the image side.

For imaging systems in the EUV range, reflective systems with multiple layers are used substantially as optical components. Preferably, Mo/Be systems are used as multilayer systems for $\lambda=11$ nm and Mo/Si systems are used for $\lambda=13$ nm.

The reflectivity of the multilayer systems used currently lies in the range of approximately 70%. Therefore a projection objective for EUV microlithography should have has as few optical components as possible, in order to achieve a sufficient light intensity.

In order to achieve a resolution that is as high as possible, on the other hand, it is necessary that the system have an aperture that is as large as possible on the image side.

For lithography systems it is advantageous if the beam path within the projection objective is free of obscurations. Projection objectives should have no mirrors with transmissive areas, especially openings, since transmissive areas lead to shading. If an objective has no mirrors with transmissive areas, the objective has an obscuration-free beam path and the exit pupil of the objective is free of shading and free of obscurations. Furthermore, the aperture diaphragm of such an objective does not need to have a shading device. A disadvantage of a system with an exit pupil being shaded, e.g., a so-called Schwarzchild mirror system, is that structures of a specific size can be imaged only with restrictions. The exit pupil is defined as the image of the aperture diaphragm formed by the optical elements arranged in the beam of the objective between the aperture diaphragm and the image plane.

4-Mirror systems for microlithography have become known, for example, from U.S. Pat. No. 5,315,629 or EP 0 480,617 B1. Such systems, however, permit a numerical aperture only of NA=0.1 on the image side with a sufficient field size of at least 1.0 mm scanning slit width. The limit of resolution lies in the range of 70 nm with the use of x-ray light with a wavelength of 10 to 30 nm.

6-Mirror systems for microlithography have been made known from the publications U.S. Pat. No. 5,153,898; EP-A-0 252,734; EP-A-0 947,882; U.S. Pat. No. 5,686,728; EP 0 779,528; U.S. Pat. No. 5,815,310; WO 99/57606; and U.S. Pat. No. 6,033,079.

Such 6-mirror systems have a numerical aperture <0.3 on the image side, which leads to a resolution limit in the range of 30 nm with the use of x-ray light with a wavelength of 10–30 nm.

Another disadvantage of both 4-mirror and 6-mirror systems is the fact that there are only a few possibilities for correction of imaging errors.

A microlithography projection objective with eight mirrors has become known from U.S. Pat. No. 5,686,728. This projection objective has a high numerical aperture of NA=0.55 on the image side. Of course, the projection objective known from U.S. Pat. No. 5,686,728 is suitable only for wavelengths longer than 126 nm, since, for example, the angle of incidence of the chief ray of the field point, which lies on the axis of symmetry in the center of the object field is so large that this 8-mirror system cannot be operated in the EUV wavelength region from 10 to 30 mn. Another disadvantage of the system according to U.S. Pat. No. 5,686,728 is that all eight mirrors are formed aspheric and that the angle of the chief ray at the object has a value of 13° with a numerical aperture of 0.11 on the object side.

SUMMARY OF THE INVENTION

A first object of the invention is to provide a suitable projection objective for lithography with short EUV wavelengths in the range of 10 to 30 nm, which is characterized by a large numerical aperture and improved possibilities of imaging correction when compared with previously known projection systems for EUV microlithography.

Another object of the invention is to provide a microlithography projection objective for lithography with wavelengths $\leq 193$ nm, which has both a large aperture and which can be manufactured in a simple manner.

According to the invention, the first object is solved by a microlithography projection objective for EUV lithography with a wavelength in the range of 10–30 nm in that the microlithography projection objective has eight mirrors instead of four or six mirrors.

The inventors have recognized surprisingly that such an objective makes available both a sufficient light intensity as well as a sufficiently large numerical aperture in order to meet the requirements for high resolution. Furthermore such an objective provides sufficient possibilities for imaging correction.

In order to achieve a resolution as high as possible, in an advantageous embodiment, the numerical aperture of the projection objective on the image side is greater than 0.2.

In order to minimize the angle of incidence of the chief ray of the field point, which lies on the axis of symmetry and in the center of the object field, the numerical aperture on the image side of the projection system according to the invention is advantageously limited to NA<0.5.

In order to force a ray bundle, or light bundle, in the direction of the optical axis (HA) and to avoid off-axis segments of the mirrors having a large distance to the optical axis (HA) in a particularly advantageous embodiment the projection objective is designed in such a way that at least one intermediate image of the object field is formed in the beam path of the rays of the projection objective between the object field and the image field.

In the present application, that part of the mirror on which the light rays that are guided through the projection objective impinge is denoted as the off-axis segment of the mirror.

The distance of the off-axis segment from the optical axis (HA) in the present application is the distance of the point of incidence of the chief ray of the central field point onto the segment of the mirror from the optical axis (HA).

In order to minimize the angle of incidence on the first mirror of the projection objective according to the invention, in a particularly advantageous embodiment of the invention, a diaphragm, which is preferably circular or nearly circular, is arranged in the light path between first and third mirrors, preferably on or in the vicinity of the first mirror, or on or in the vicinity of the second mirror. "In the vicinity" in the present application is understood as the distance of the diaphragm from the closest mirror that is less than $1/10^{th}$ the distance from the preceding mirror to the mirror in the vicinity of the diaphragm. For example, "in the vicinity of S2" means that the following applies:

$$\overline{BS_2} \leq \tfrac{1}{10} \overline{S1S2}$$

Wherein $\overline{BS_2}$ denotes the distance of the diaphragm to the second mirror and $\overline{S1S2}$ denotes the distance between the first and second mirror. Such an arrangement permits a minimal separation of the ray bundle in the front part of the objective. This means that the angles of incidence on the first, second and third mirrors are reduced. In addition, such an arrangement of the diaphragm yields a configuration where the off-axis segment of the third mirror lies directly below the optical axis and is nearly a mirror image of the off-axis segment of the first mirror S1. Furthermore, the angles of incidence on the fourth and fifth mirrors are reduced, since the distance of the ray bundle from the optical axis between the fourth and fifth mirrors is minimal.

In order to produce small angles of incidence on the mirrors, it is further of advantage, if the distances between the off-axis segments of the mirrors and the optical axis (HA) are kept small. Since these distances can be varied randomly by an appropriate scaling, they are characterized by their size ratio relative to the structural length of the objective in the present application. It is particularly advantageous, if the following relation is fulfilled:

the distance of the off-axis segment of each mirror to the optical axis<0.3 times structural length of the objective and preferably:

the distance of the off-axis segment of each mirror to the optical axis<0.25 times structural length of the objective.

With the aforementioned relation, small angles of incidences are produced.

In a further form of embodiment of the invention, the radius of curvature of at least one mirror is larger than the structural length of the projection objective. The distance from the object to be imaged up to its image is understood as the structural length of the system in the present application. It is particularly advantageous that the aforementioned condition for the radius of curvature applies to the second, third and fourth mirrors so that the paths of the ray bundles from the first to the second mirrors and from the third to the fourth mirrors are nearly parallel. With such a configuration, a minimal separation of the ray bundles and large drift paths is achieved. In the present application, the distance between the vertexes of two consecutive mirrors in the light path is to be understood as the drift path. The aforementioned conditions contribute to small angles of incidence on the mirrors.

The projection objective can be further characterized from the sum of (a) the lengths of all drift paths between pairs of sequential mirrors in said light path, (b) the length from said object plane to a vertex of said first mirror (S1) in said light path, and (c) the length from a vertex of said eighth mirror (S8) to said image plane in said light path, as indicated in the following formula:

$$\begin{aligned}
\text{sum} = {}& \text{length of drift path}_{S1S2} + \\
& \text{length of drift path}_{S2S3} + \\
& \text{length of drift path}_{S3S4} + \\
& \text{length of drift path}_{S4S5} + \\
& \text{length of drift path}_{S5S6} + \\
& \text{length of drift path}_{S6S7} + \\
& \text{length of drift path}_{S7S8} + \\
& \text{length from object plane to vertex}_{S1} + \\
& \text{length from vertex}_{S8} \text{ to image plane.}
\end{aligned}$$

In a preferred embodiment, this sum is at least 2.5 times the structural length of the projection objective. The projection objective is preferably further characterized in that at least one drift path is longer than 70% of the structural length of the projection objective.

In another embodiment of the invention, the microlithography projection objective is designed in such a way, that the angle of the chief ray at the object is smaller than twice the value of the object-side aperture (NAO). This is an advantage, since shading effects on a mask are reduced thereby.

It is a particular advantage if the projection objective has two intermediate images. The first intermediate image in a system with two intermediate images is formed preferably between the second and third mirror. This leads to the fact that the first, second, third and fourth mirrors have off-axis segments in the vicinity of the axis. In order to assure off-axis segments near to the axis for as many mirrors as possible in the objective part comprising the fifth, sixth, seventh and eighth mirrors, it is advantageous that the projection objective is designed in such a way that the second intermediate image is formed in the path of the rays between the sixth and seventh mirrors. It is particularly preferred, if the angle of incidence of the chief ray of the field point, which lies on the axis of symmetry in the center of the object field, is smaller than 20° on all mirrors, in the case of a system with two intermediate images.

In a preferred embodiment with two intermediate images, at least one of the eight mirror surfaces is formed spherical.

It is particularly advantageous if those mirrors of the objective with the largest distance of the off-axis segment from the optical axis is/are formed spherical, since the interferometric testability of off-axis aspheric profiles becomes difficult with an off-axis segment having a large distance to the optical axis. In general the interferometric testability becomes more difficult if the distance between the off-axis segment and the optical axis becomes larger.

In a system with two intermediate images between the second and third mirror as well as between the sixth and seventh mirror, the sixth mirror is the mirror with the off-axis segment with the largest distance from the optical axis. In such an embodiment, preferably the sixth mirror is formed spherical for the sake of interferometric testability.

In addition to the projection objective, the invention also provides a projection exposure system, wherein the projection exposure system comprises an illumination device for illuminating a ring field as well as a projection objective according to the invention.

BRIEF DESCRIPTION OF THE DRAWINGS

The invention will be described below on the basis of examples of embodiment.

Here.

DESCRIPTION OF THE INVENTION

Figure 1:
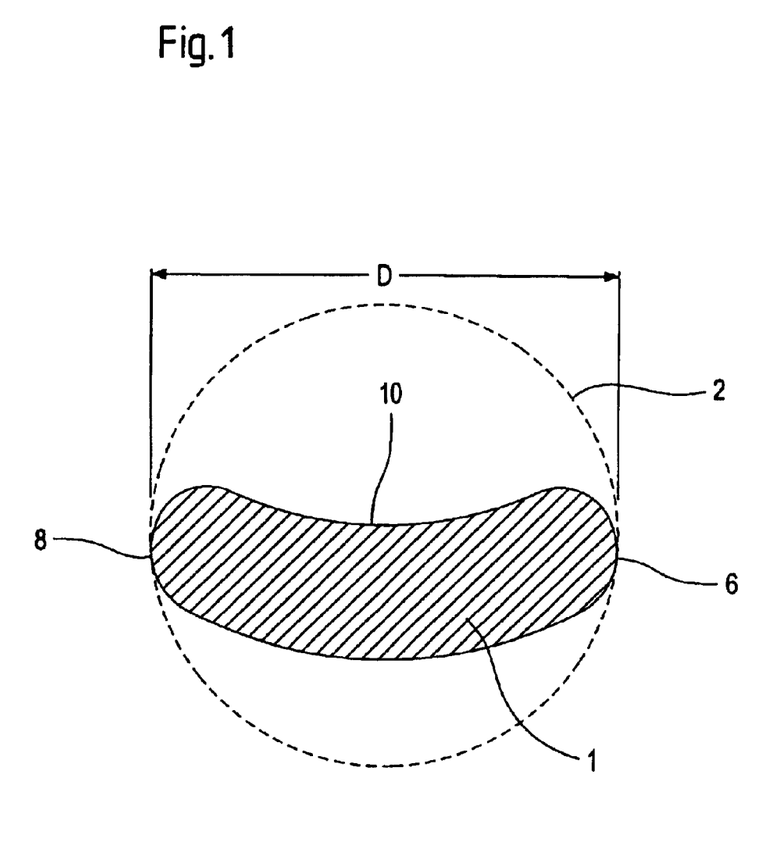
FIG. 1: the shape of an off-axis segment of a mirror.

In FIG. 1 is shown what is to be understood in the present application as off-axis segments of a mirror and the diameter of such an off-axis segment.

FIG. 1 shows a kidney-shaped field as an example of a projected field 1 on a mirror of the projection objective. Such a shape is expected for the off-axis segments in an objective according to the invention, if used in a microlithography projection exposure system. The enveloping circle 2 completely encloses the kidney shape and coincides with edge 10 of the kidney shape at two points 6, 8. The enveloping circle is always the smallest circle that encloses the off-axis segment. Diameter D of the off-axis segment then results from the diameter of enveloping circle 2.

Figure 2:
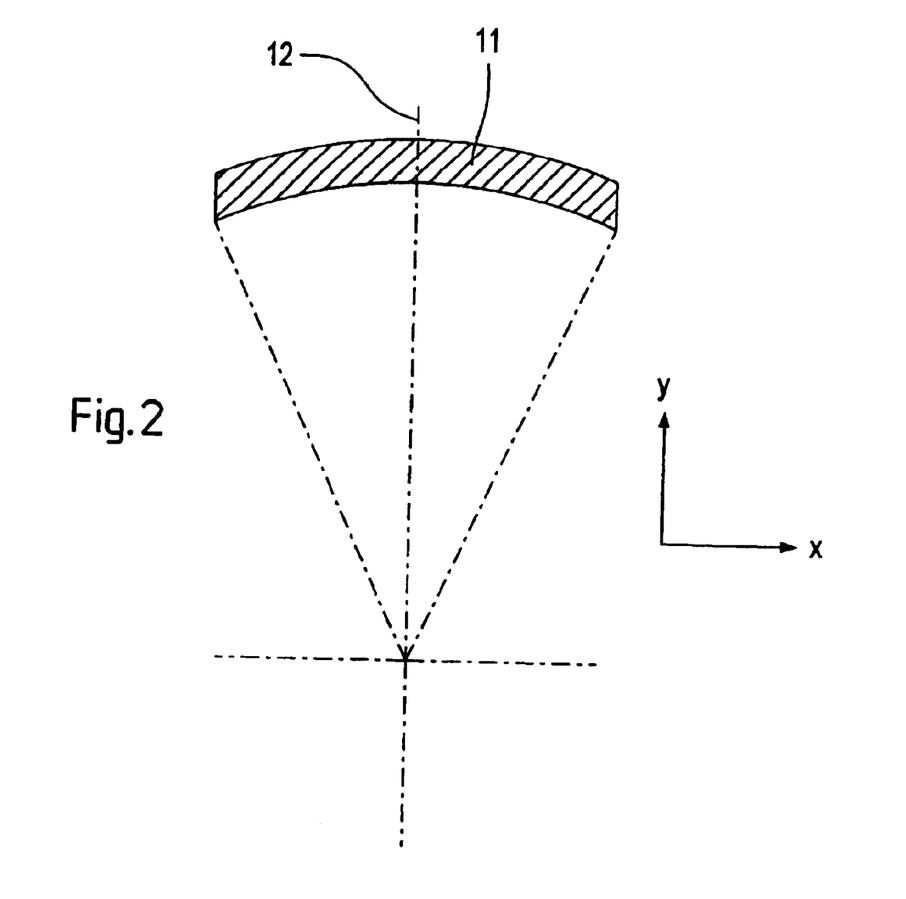
FIG. 2: the ring field in the object plane or image plane of the objective.

In FIG. 2, the object field 11 of a projection exposure system is shown in the object plane of the projection objective, which is imaged by means of the projection objective according to the invention in an image plane, in which a light-sensitive object, for example, a wafer is arranged. The shape of the image field corresponds to that of the object field 11. With reduction objectives, as frequently used in microlithography, the image field is reduced by a predetermined factor with respect to the object field 11. The object field 11 has the configuration of a segment of a ring field. The segment has an axis of symmetry 12.

The image field represents a segment of the ring field. The segment has an axis of symmetry and an extension perpendicular to the axis of symmetry and the extension is at least 20, preferably at least 25 mm.

In addition, the axes defining the object plane or image plane, i.e., the x-axis and the y-axis, are shown in FIG. 2. As can be seen from FIG. 2, the axis of symmetry 12 of object field 11 runs in the direction of the y-axis. At the same time, the y-axis coincides with the scanning direction of an EUV projection exposure system, which is designed as a ring-field scanner. The x-direction is thus the direction that stands perpendicular to the scanning direction, within the object plane.

The optical axis HA of the system extends in the z-direction.

Figure 3:
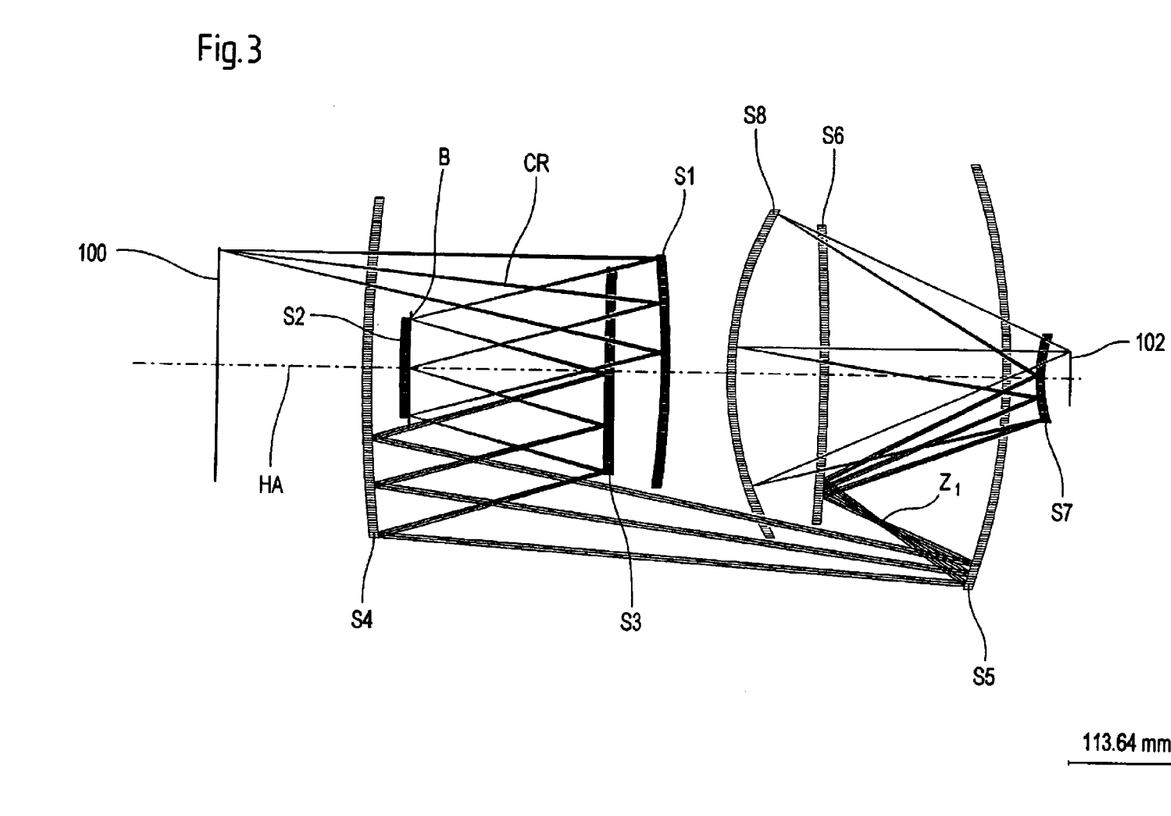
FIG. 3: a first embodiment of a projection objective according to the invention with eight mirrors with one intermediate image.

A first example of embodiment of a projection objective, which can be used in the EUV range with $\lambda$=10–30 nm and is characterized by small angles of incidence on all mirrors, is shown in FIG. 3.

The object in object plane 100 is imaged in image plane 102, in which, for example, a wafer can be arranged, by means of the projection objective. The projection objective according to the invention comprises a first mirror S1, a second mirror S2, a third mirror S3, a fourth mirror S4, a fifth mirror S5, a sixth mirror S6, a seventh mirror S7 as well as an eighth mirror S8. In the example of the embodiment shown in FIG. 3, all mirrors S1, S2, S3, S4, S5, S6, S7 and S8 are formed as aspheric mirrors. The system comprises an intermediate image Z1 between the fifth S5 and the sixth S6 mirrors.

The system is centered relative to the optical axis HA and is telecentric on the image side, i.e., in image plane 102. Image-side telecentry is understood to mean that the chief ray CR impinges onto the image plane 102 at an angle of close to or approximately 90°.

Within the mirror system, in order to keep light losses as well as coating-induced wavefront aberrations as small as possible, in the embodiment according to FIG. 3 the angle of incidence of the chief ray CR of the central field point on the respective mirror surface is less than 45°, preferably less than 26° and most preferably less than 20°. The angles of incidence of the chief ray of the central field point are shown in Table 1:

TABLE 1

Angles of incidence of the chief ray of the central field point for the example of embodiment of FIG. 3.

| Mirror | Angle of incidence |
| --- | --- |
| 1 | 10.5° |
| 2 | 15.0° |
| 3 | 14.9° |
| 4 | 11.0° |
| 5 | 10.6° |
| 6 | 25.6° |
| 7 | 15.7° |
| 8 | 4.7° |

The 8-mirror objective shown in FIG. 3 has an aperture of NA=0.4 on the image side and a scanning slit width of 1 mm. In order to minimize the angle of incidence on the individual mirrors, the following measures are taken: the angle of the chief ray at object 100 is minimized, whereby the aperture on the object side is NAO=0.1. The angle of incidence on the first mirror is minimized in this way. The maximal chief-ray angle at the object amounts to only 6.1° with the indicated numerical aperture NAO of 0.1 on the object side and is thus substantially smaller than the maximal chief-ray angle of 13° according to U.S. Pat. No. 5,686,728.

Figure 4A:
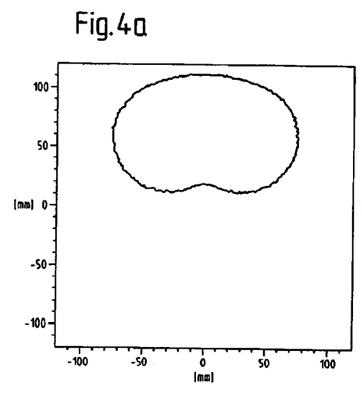
FIGS. 4A–4H: the off-axis segments of mirrors S1–S8 of the first embodiment.
Figure 4B:
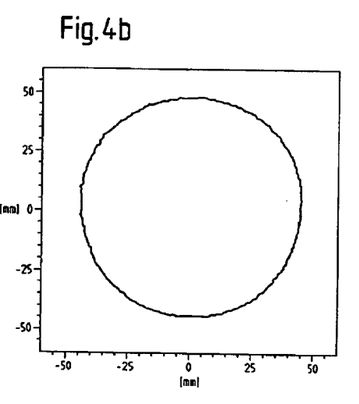
Figure 4C:
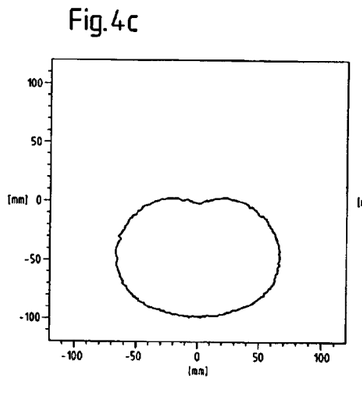
Figure 4D:
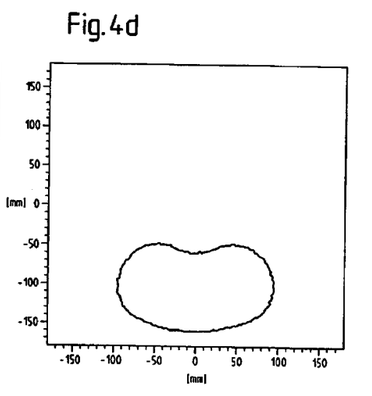
Figure 4E:
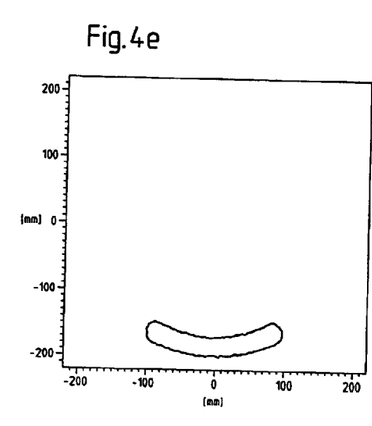
Figure 4F:
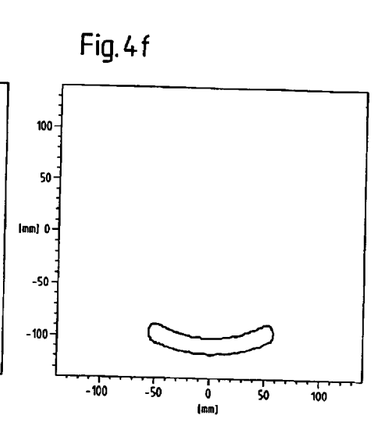
Figure 4G:
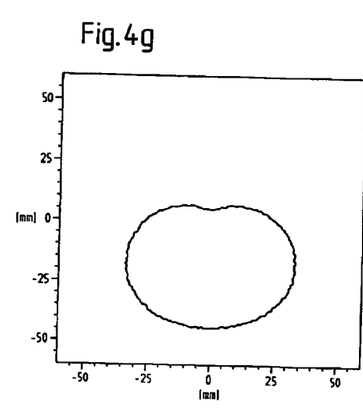
Figure 4H:
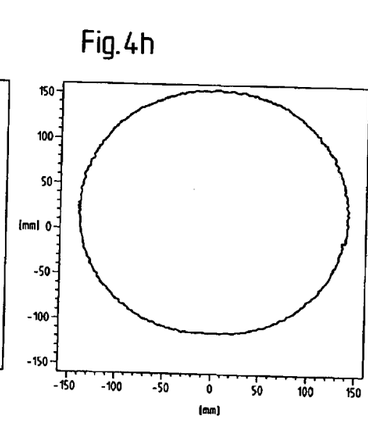

A physical diaphragm is localized on the second mirror S2. This permits a minimal separation of a ray bundle, also known as a light bundle, in the front part of the objective, which reduces the angles of incidence on S1, S2 and S3. In addition, this causes the off-axis segment of S3 to lie directly below the optical axis and to be nearly a mirror image of the off-axis segment of the first mirror S1. This is in contrast, for example, to the 8-mirror objective for wavelengths >126 nm shown in U.S. Pat. No. 5,686,728. Further more, the angles of incidence on S4 and on S5 are reduced, since the distance of the ray bundle from the optical axis between S4 and S5 is minimal. The off-axis segments of the mirrors are shown in FIGS. 4A–4H. FIG. 4A shows the off-axis segment of mirror S1, FIG. 4B shows the off-axis segment of mirror S2, FIG. 4C shows the off-axis segment of mirror S3 , FIG. 4D shows the off-axis segment of mirror S4 , FIG. 4E shows the off-axis segment of mirror S5, FIG. 4F shows the off-axis segment of mirror S6, FIG. 4G shows the off-axis segment of mirror S7 and FIG. 4H shows the off-axis segment of mirror S8 of the embodiment of an 8-mirror objective according to FIG. 3.

In addition, the radius of curvature of at least one of the mirrors S2 to S4 is selected large enough, preferably larger than the structural length of the projection objective. Due to this, the drift path is as large as possible and the paths of the ray bundle from S1 to S2 and from S3 to S4 lie nearly parallel. The same holds true for the paths of the ray bundle from S2 to S3 and from S4 to S5. Furthermore, a minimal separation of the ray bundle also results from this.

The wavefront has a maximal rms value of less than $0.030\lambda$. The distortion is corrected via the scanning slit to a maximum value of 1 nm and has the form of a third-degree polynomial, so that the dynamic scan averaged distortion is minimized. The curvature of the image field is corrected by considering the Petzval condition.

Figure 8:
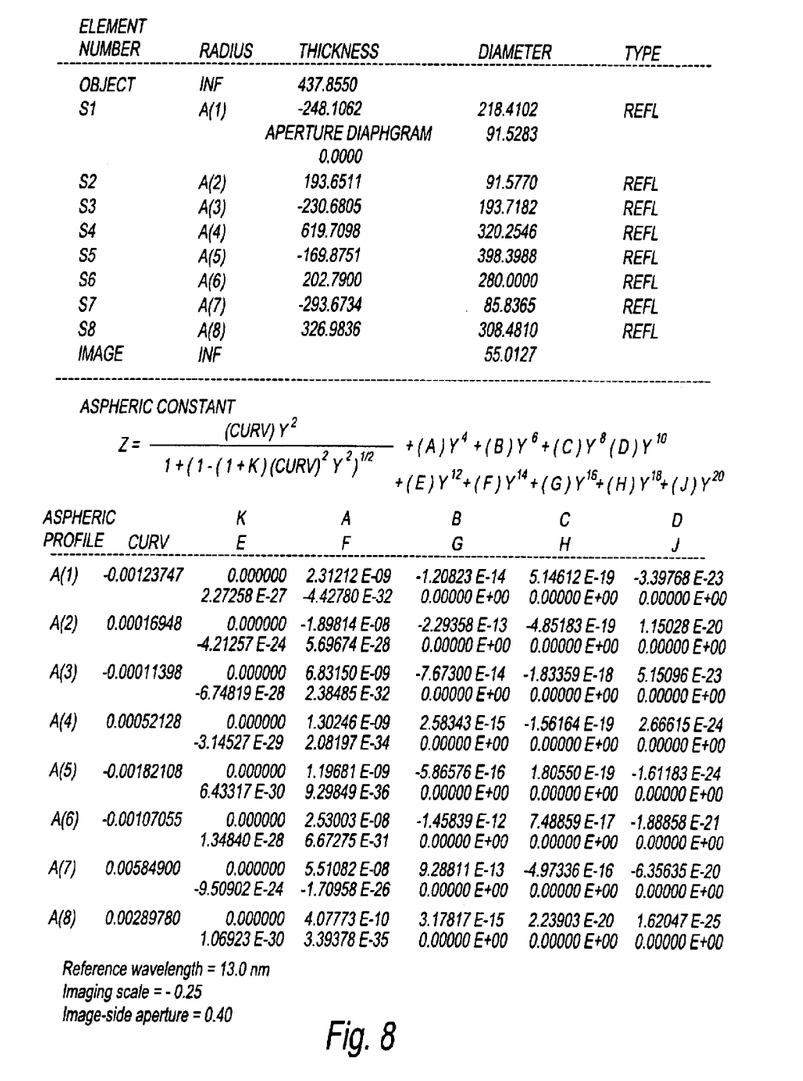
FIG. 8: table with optical data for the embodiment according to FIG. 3.

The exact data of the objective according to FIG. 3 are reproduced in Code V format in FIG. 8.

In the 8-mirror objective shown in FIG. 3, the light path from the object plane to the image plane is free from obscurations. This is because the off-axis segments of all eight mirrors, and thus the light path from the object plane to the image plane, are not shaded, as is apparent from FIGS. 4A–4H.

Figure 5:
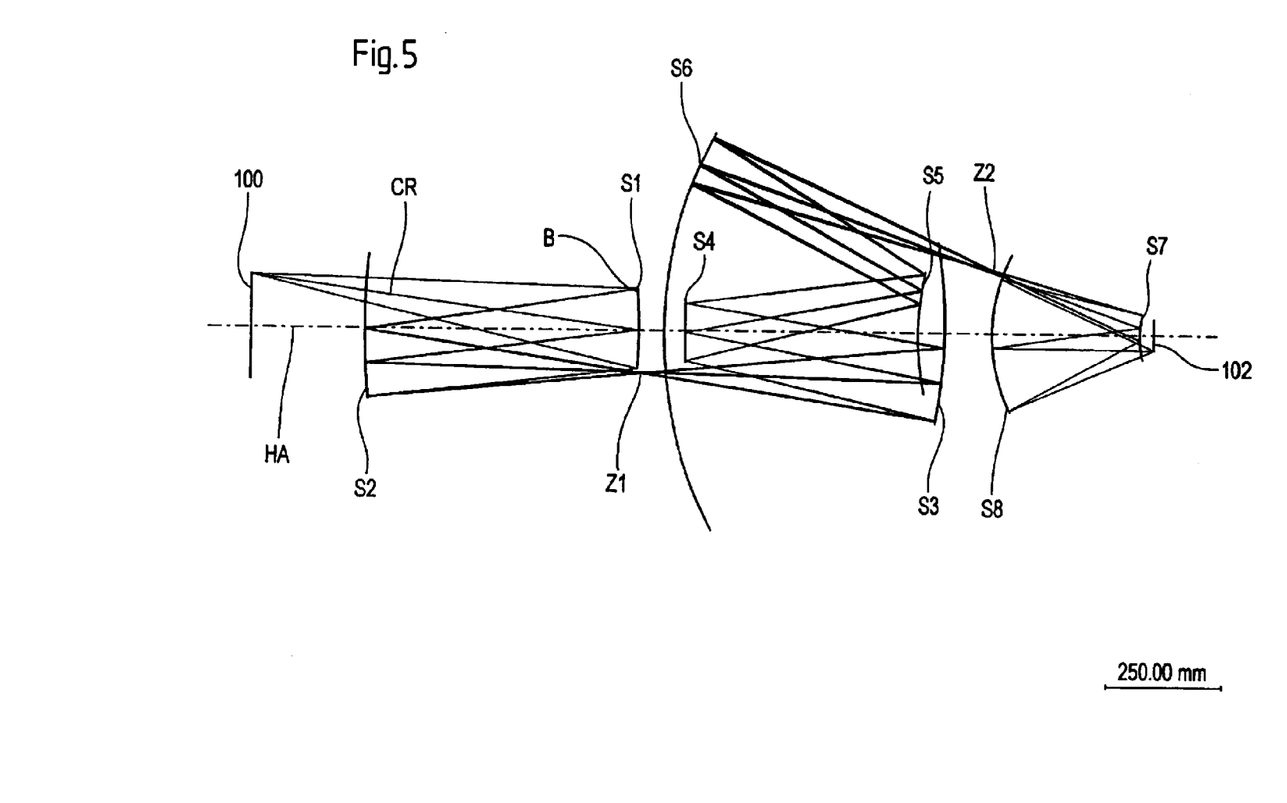
FIG. 5: a second embodiment of a projection objective according to the invention with seven aspheric mirrors and one spherical mirror, as well as two intermediate images.

FIG. 5 shows a second embodiment of an 8-mirror objective according to the invention with mirrors S1, S2, S3, S4, S5, S6, S7 and S8 . The same components as in FIG. 3 are given the same reference numbers.

In order to provide an 8-mirror objective that is economic to manufacture and can be interferometrically tested, in a preferred embodiment, the mirror with the off-axis segment having the largest distance from the optical axis is spherical.

In order to minimize the angle of incidence and to orient the ray bundle in the direction of the optical axis and thus to avoid off-axis segments of the mirrors having a large distance to the optical axis, the embodiment according to FIG. 5 has two intermediate images Z1, Z2.

In the example of embodiment shown in FIG. 5 with two intermediate images, mirrors S1, S2, S3, S4, S5 as well as S7 and S8 are aspheric, while mirror S6 with the off-axis segment having the largest distance to the axis, is spherical. The system has an aperture of NA=0.4 on the image side. Based on the example of embodiment in FIG. 5, it is clear that the first intermediate image between S2 and S3 provides for the fact that the first four mirrors S1, S2, S3, S4 have off-axis segments in the vicinity of the axis. This cannot be assured to this extent in the back high-aperture part of the objective by the second intermediate image Z2 alone. The sixth mirror S6 thus has an off-axis segment with a large distance to the axis. If mirror S6 is aspheric, then it would be difficult to test it with on-axis test optics. Thus, it is formed spherical according to a preferred embodiment of the invention. The angles of incidence of the chief ray of the central field point are reproduced in the following Table 2:

TABLE 2

Angles of incidence of the chief ray of the central field point for the example of embodiment of FIG. 5.

| Mirror | Angle of incidence |
| --- | --- |
| S1 | 7.5° |
| S2 | 4.4° |
| S3 | 4.6° |
| S4 | 10.5° |
| S5 | 19.4° |
| S6 | 4.6° |
| S7 | 14.0° |
| S8 | 4.2° |

Figure 6A:
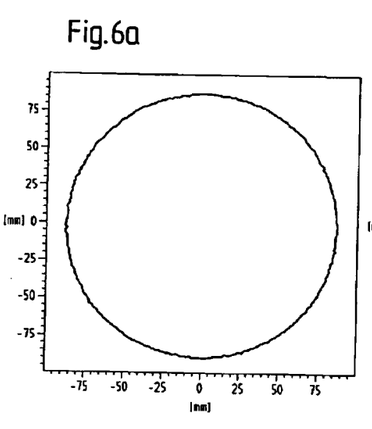
FIGS. 6A–6H: the off-axis segments of mirrors of Sb1–S8 of the second embodiment.
Figure 6B:
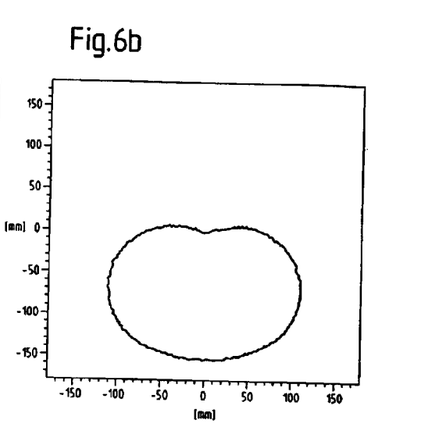
Figure 6C:
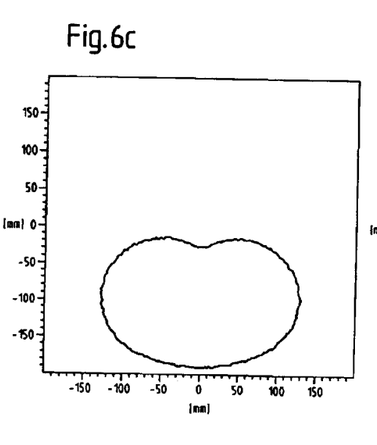
Figure 6D:
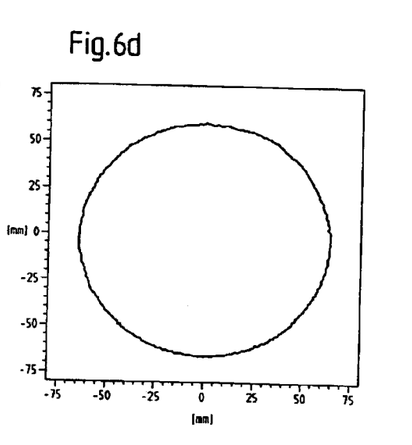
Figure 6E:
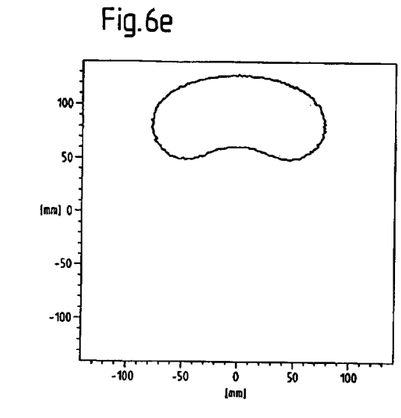
Figure 6F:
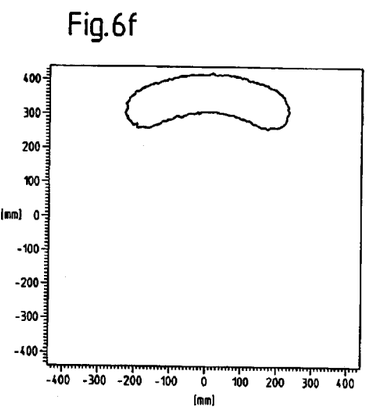
Figure 6G:
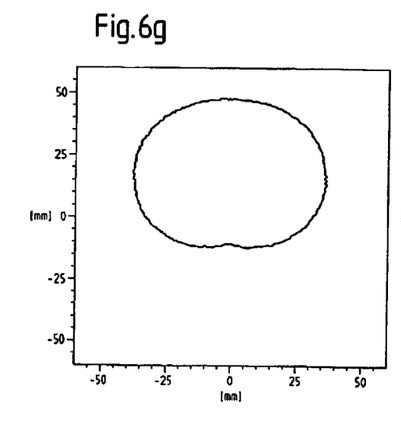
Figure 6H:
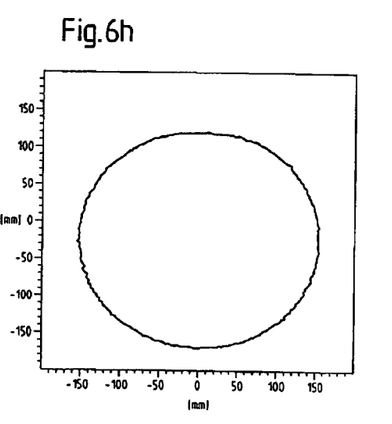

The off-axis segments of the individual mirror segments are shown in FIGS. 6A–6H. Thus, FIG. 6A shows the off-axis segment of mirror S1, FIG. 6B shows the off-axis segment of mirror S2, FIG. 6C shows the off-axis segment of mirror S3 , FIG. 6D shows the off-axis segment of mirror S4 , FIG. 6E shows the off-axis segment of mirror S5 , FIG. 6F shows the off-axis segment of mirror S6, FIG. 6G shows the off-axis segment of mirror S7 and FIG. 6H shows the off-axis segment of mirror S8 of the embodiment of an 8-mirror objective according to FIG. 5.

Figure 9:
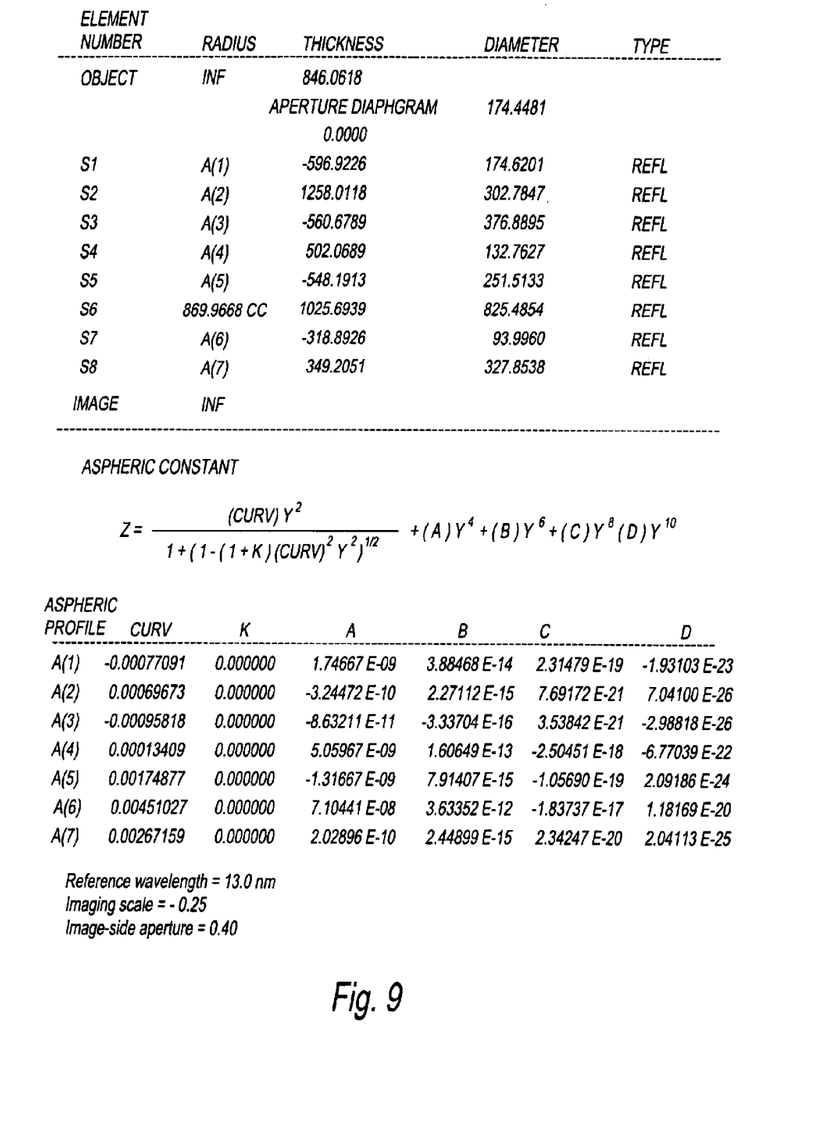
FIG. 9: table with optical data for the embodiment according to FIG. 5.

The exact data of the objective according to FIG. 5 are shown in Code V format in FIG. 9.

In the 8-mirror objective shown in FIG. 5, the light path from the object plane to the image plane is free from obscurations. This is because the off-axis segments of all eight mirrors, and thus the light path from the object plane to the image plane, are not shaded, as is apparent from FIGS. 6A–6H.

In the two forms of embodiment of the invention, the distances of the off-axis segments of the mirror to the optical axis are advantageously minimized in order to produce small angles of incidence onto the mirrors. Since these distances can be varied randomly by an appropriate scaling, they are characterized by their size relative to the structural length of the objective. The ratios of the values of the distances of the off-axis segments to the axis divided by the structural length are listed in Table 5 below for all mirrors of the two embodiments.

TABLE 3

Ratio of the distances of the off-axis segments divided by the structural length

| Mirror | Example of embodiment according to FIG. 3 | Example of embodiment according to FIG. 5 |
| --- | --- | --- |
| 1 | 0.078 | 0.000 |
| 2 | 0.000 | 0.040 |
| 3 | 0.062 | 0.054 |
| 4 | 0.133 | 0.002 |
| 5 | 0.221 | 0.046 |
| 6 | 0.129 | 0.179 |
| 7 | 0.025 | 0.010 |
| 8 | 0.028 | 0.016 |

The projection objective of the present invention can be employed in a projection exposure system. In addition to the projection objective, such a system would include an EUV radiation source, an illumination device that partially collects the radiation and further conducts the radiation to illuminate a ring field, a mask that bears a structure or pattern on a support system, wherein the mask is arranged in a plane of the ring field, and wherein the projection objective images an illuminated part of the mask in the image field, and a light-sensitive substrate on a support system, wherein the light-sensitive substrate is arranged in a plane of the image field.

Figure 7:
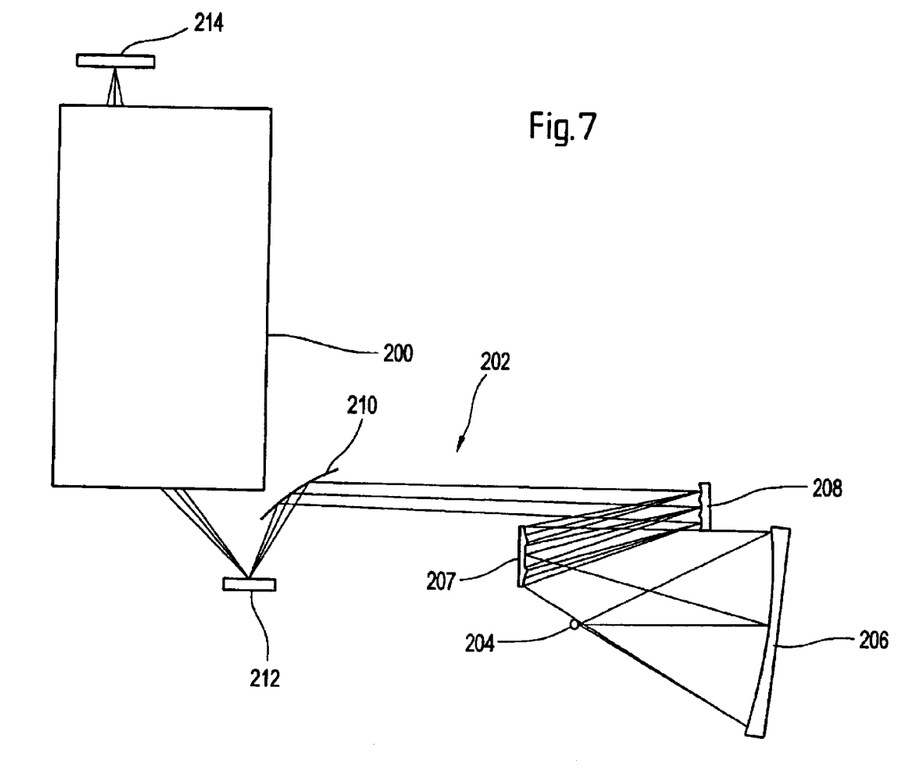
FIG. 7: a projection exposure system with an objective according to the invention.

FIG. 7 shows a projection exposure system for microlithography with an 8-mirror projection objective 200 according to the invention. The illumination system 202 can be configured as described, for example, in EP 99106348.8 with the title "Illumination system, particularly for EUV lithography" or U.S. Ser. No. 09/305,017, now U.S. Pat. No. 6,198,793, with the title "Illumination system particularly for EUV lithography", whose disclosure content is incorporated to the full extent in the present application. Such an illumination system contains an EUV light source 204. The light of the EUV light source is collected by collector mirror 206. Reticle 212 is illuminated by means of a first mirror 207 comprising raster elements, so-called field honeycombs, and a second mirror 208 comprising elements, so-called pupil honeycombs, as well as a mirror 210. The light reflected from reticle 212 is imaged by means of the projection objective 200 according to the invention on to a support 214 bearing a light-sensitive layer.

The projection exposure system of FIG. 7 can be used for the manufacturing of chips, e.g., integrated circuits. Such a method includes the steps of (a) employing the projection exposure system to provide a projection beam from the EUV radiation source and the illumination system, (b) providing a substrate that is at least partially covered by a layer of radiation sensitive material, (c) using a mask to endow the projection beam with a pattern in its cross-section, and (d) using the projection objective to project the patterned beam onto a target portion of the layer of radiation sensitive material.

A projection objective with eight mirrors is provided for the first time by the invention, which is characterized by an applicability in the EUV wavelength region with $\lambda=11$ to 30 nm and represents a particularly advantageous, compact projection objective from the constructional and manufacturing points of view.

Furthermore, the projection objective according to the invention provides for a high aperture and a beam path free of obscurations. This leads to an exit pupil free of shading.

What is claimed is:

1. A projection objective that provides a light path for a light bundle from an object field in an object plane to an image field in an image plane, said projection objective comprising:

a first mirror (S1);

a second mirror (S2);

a third mirror (S3);

a fourth mirror (S4);

a fifth mirror (S5);

a sixth mirror (S6);

a seventh mirror (S7); and an eighth mirror (S8), wherein said light path is provided via said eight mirrors, wherein said light bundle includes light with a wavelength in the range of 10–30 nm, and wherein said light path is free of shading.

2. The projection objective of claim 1, further comprising an exit pupil free of shading.

3. The projection objective of claim 1, further comprising a diaphragm (B) in said light pat between said object plane and said image plane.

4. The projection objective of claim 3, wherein said diaphragm (B) is arranged in said light path between said object plane and said third mirror (S3).

5. The projection objective of claim 3, wherein said diaphragm (B) is circular or nearly circular.

6. The projection objective of claim 1, wherein said mirrors (S1, S2, S3, S4, S5, S6, S7, S8) are arranged centered relative to an optical axis (HA).

7. The projection objective of claim 1, wherein the projection objective has a numerical aperture NA >0.2 on an image side.

8. The projection objective of claim 7, wherein said numerical aperture NA is <0.5.

9. The projection objective of claim 1, wherein the projection objective forms an intermediate image of said object field in said light path between said object plane and said image plane.

10. The projection objective of claim 1, wherein said image field represents a segment of a ring field, wherein said segment has an axis of symmetry and an extension perpendicular to said axis of symmetry, and wherein said extension is at least 20 mm.

11. The projection objective of claim 10, wherein the projection objective has an object-side aperture (NAO), wherein said light bundle has a chief ray of a field point that lies on said axis of symmetry and in a center of said object field, and wherein said chief ray has an angle of incidence that is smaller than twice the value of said object-side aperture (NAO).

12. The projection objective of claim 10, wherein said light bundle has a chief ray of a field point that lies on said axis of symmetry and in a center of said object field, and wherein said chief ray has an angle of incidence <45° on all said mirrors (S1, S2, S3, S4, S5, S6, S7, S8).

13. The projection objective of claim 1, wherein said eight mirrors (S1, S2, S3, S4, S5, S6, S7, S8) each comprise an off-axis segment onto which said light bundle impinges, and wherein for each said mirror, a distance of said off-axis segment to an optical axis is at most 30% of a strutural length of the projection objective.

14. The projection objective of claim 1, wherein the projection objective is telecentric on an image side.

15. The projection objective of claim 1, wherein at least one of said mirrors (S1, S2, S3, S4, S5, S6, S7, S8) has a radius of curvature that is greater than a structural length of the projection objective.

16. The projection objective of claim 1, wherein at least one of said second mirror (S2), said third mirror (S3) and said fourth mirror (S4) has a radius of curvature that is greater than a structural length of the projection objective.

17. The projection objective of claim 1, wherein said projection objective has a drift path that is formed between two of said mirrors (S1, S2, S3, S4, S5, S6, S7, S8) and that is longer th,an 70% of a structural length of the projection objective.

18. The projection objective of claim 1, wherein the projection objective is characterized by a sum of (a) the lengths of all drift paths between pairs of sequential mirrors in said light path, (b) the length from said object plane to a vertex of said first mirror (S1) in said light path, and (c) the length from a vertex of said eighth mirror (S8) to said image plane in said light path, as represented by the following formula:

sum =length of drift path$_{S1S2}$

+length of drift path$_{S2S3}$

+length of drift path$_{S3S4}$

+length of drift path$_{S4S5}$

+length of drift path$_{S5S6}$

+length of drift path$_{S6S7}$

+length of drift path$_{S7S8}$

+length from object plane to vertex$_{S1}$

+length from vertex$_{S8}$ to image plane, wherein said sum is at least 2.5 times a structural length of the projection objective.

19. The projection objective of claim 1, further comprising:

a first subsystem;

a second subsystem; and a third subsystem, wherein said first subsystem images said object field in a first intermediate image of said object field, wherein said second subsystem images said first intermediate image of said object field in a second intermediate image of said object field, and wherein said third subsystem images said second intermediate image of said object field in said image field.

20. The projection objective of claim 19, wherein each of said first, second and third subsystems comprises at least two of said mirrors.

21. The projection objective of claim 19, wherein said first subsystem comprises said first and second mirror (S1, S2), said second subsystem comprises said third, fourth, fifth and sixth mirror (S3, S4, S5, S6) and said third subsystem comprises said seventh and eighth mirror (S7, S8).

22. The projection objective of claim 1, wherein at least one of said eight mirrors (S1, S2, S3, S4, S5, S6, S7, S8) is spherical.

23. The projection objective of claim 1, wherein seven of said eight mirrors are aspheric and one of said eight mirrors is spherical, wherein said spherical mirror has an off-axis segment larger distance to an optical axis than that of said aspheric mirrors.

24. The projection objective of claim 1, wherein said sixth mirror (S6) is spherical.

25. A projection exposure system, comprising:

the projection objective of claim 1;

an EUV radiation source;

an illumination device that partially collects said radiation and further conducts said radiation to illuminate a ring field;

a mask that bears a structure or pattern on a support system, wherein said mask is arranged in a plane of said ring field, and wherein said projection objective images an illuminated part of said mask in said image field; and a light-sensitive substrate on a support system, wherein said light-sensitive substrate is arranged in a plane of said image field.

26. A device manufacturing method comprising:

employing the projection exposure system of claim 25, to provide a projection beam from said EUV radiation source and said illumination system;

providing a substrate that is at least partially covered by a layer of radiation sensitive material;

using a mask to endow said projection beam with a pattern in its cross-section; and using the projection objective to project the patterned beam onto a target portion of said layer of radiation sensitive material.

27. A projection objective that provides a light path for light from an object field in an object plane to an image field in an image plane, said projection objective comprising:

a first mirror (S1);

a second mirror (S2);

a third mirror (S3);

a fourth mirror (S4);

a fifth mirror (S5);

a sixth mirror (S6);

a seventh mirror (S7);

an eighth mirror (S8); and a diaphragm (B);

wherein said light path is provided via said eight mirrors and said diaphragm, wherein said light bundle includes light with a wavelength in the range of 10–30 nm, and wherein said diaphragm (B) is free of shading.

28. The projection objective of claim 27, wherein said diaphragm (B) is arranged in said light path between said object plane and said third mirror (S3).

29. The projection objective of claim 22, wherein said diaphragm (B) is circular or nearly circular.

* * * * *